(12) United States Patent
Zadeh (10) Patent No.: US 7,642,498 B2
(45) Date of Patent: Jan. 5, 2010

(54) CAPACITOR MULTIPLER CIRCUITS AND THE APPLICATIONS THEREOF TO ATTENUATE ROW-WISE TEMPORAL NOISE IN IMAGE SENSORS

(75) Inventor: Ali E. Zadeh, Sierra Madre, CA (US)

(73) Assignee: Aptina Imaging Corporation, George Town (KY)

( * ) Notice: Subject to any disclaimer, the term of this patent is extended or adjusted under 35 U.S.C. 154(b) by 32 days.

(21) Appl. No.: 11/696,608

(22) Filed: Apr. 4, 2007

(65) Prior Publication Data
US 2008/0246539 A1    Oct. 9, 2008

(51) Int. Cl.
*H01L 27/00*    (2006.01)
*H01J 40/14*    (2006.01)

(52) U.S. Cl. .............................. 250/208.1; 250/214 R (58) Field of Classification Search .............. 250/208.1, 250/214 R; 348/300, 301, 302, 308; 327/552, 327/558, 559
See application file for complete search history.

(56) References Cited

U.S. PATENT DOCUMENTS

| 6,633,193 | B1 | 10/2003 | Halamik et al. | |
|---|---|---|---|---|
| 6,731,164 | B2 | 5/2004 | Johnston | |
| 6,778,004 | B1* | 8/2004 | Jackson | 327/538 |
| 6,788,146 | B2 | 9/2004 | Forejt | |
| 6,806,762 | B2 | 10/2004 | Stair et al. | |
| 6,943,619 | B1* | 9/2005 | Shuler, Jr. | 327/554 |
| 7,092,017 | B2 | 8/2006 | Kelly | |
| 7,113,020 | B2 | 9/2006 | Schoenbauer | |
| 2003/0006809 | A1 | 1/2003 | Enriquez | |
| 2004/0165093 | A1* | 8/2004 | Dosluoglu et al. | 348/308 |
| 2005/0099221 | A1* | 5/2005 | Kim et al. | 327/356 |
| 2005/0110884 | A1 | 5/2005 | Altice, Jr. | |
| 2006/0273845 | A1 | 12/2006 | Kim | |
| 2007/0165430 | A1* | 7/2007 | Chen et al. | 363/62 |

FOREIGN PATENT DOCUMENTS

| EP | 1085653 | 3/2001 |
|---|---|---|
| JP | 2004260828 | 9/2004 |

(Continued)

OTHER PUBLICATIONS

Benthien S., Lule T., Schneider B., Wagner M., Verhoeven M., Bohm M.; Vertically integrated Sensors for Advanced Imaging Applications; IEEE Journal of Solid-State Circuits; Jul. 2000; vol. 35, Issue: 7; pp. 939-945 (http://ieeexplore.ieee.org/iel5/4/18446/00848201.pdf?tp=&isnumber=18446&arnumber=848201&punumber=4).

(Continued)

*Primary Examiner*—Georgia Y Epps
*Assistant Examiner*—Pascal M Bui-Pho
(74) *Attorney, Agent, or Firm*—Treyz Law Group (57) ABSTRACT

The various embodiments disclose capacitor multiplier circuits that may be integrated into imaging devices, such as for semiconductor Complimentary Metal Oxide Semiconductor (CMOS) image sensors, to create an effective capacitance in response to a low frequency, such as row-wise temporal noise, that may be generated along a row of image sensor pixels. The created effective capacitance from any one of the capacitor multiplier circuits along with a small signal resistance created by a trans-conductance of a current biasing transistor form a low pass filter that will attenuate the low frequency noise.

11 Claims, 7 Drawing Sheets

FOREIGN PATENT DOCUMENTS

| | | |
|---|---|---|
| KR | 20020083416 | 11/2002 |
| TW | 563349 B | 11/2003 |
| WO | WO0227763 | 4/2002 |

OTHER PUBLICATIONS

V. Gruev, R. Etienne-Cummings; A Pipelined Temporal Difference Imager; IEEE Journal of Solid-State Circuits; Mar. 2004; vol. 39, Issue: 3; pp. 538-543; (http://ieeexplore.ieee.org/xpl/freeabs_all.jsp?arnumber=1269933).

G. Yang, O. Yadid-Pecht, C. Wrigley, B. Pain; A Snap-Shot CMOS Active Pixel Imager for Low-Noise, High-Speed Imaging; Electron Devices Meeting, 1998. IEDM '98 Technical Digest., International Publication Date: Dec. 6-9, 1998; pp. 45-48; (http://ieeexplore.ieee.org/iel4/6036/16109/00746243.pdf?tp=&isnumber=16109&arnumber=746243&punumber=6036).

K. Yonemoto, H. Sumi; A Numerical Analysis of a CMOS Image Sensor with a Simple Fixed-Pattern-Noise-Reduction Technology; IEEE Transactions on Electron Devices; Publication Date: May 2002; vol. 49, Issue: 5; pp. 746-753 (http://ieeexplore.ieee.org/iel5/16/21545/00998580.pdf?tp=&isnumber=21545&arnumber=998580&punumber=16).

S Kleinfelder, F. Bieser, Y. Chen, R. Gareus, H.S. Matis, M. Oldenburg, F. Retiere, H.G. Ritter, H.H. Wieman, E. Yamamoto; Novel Integrated CMOS Sensor Circuits; IEEE Transactions on Nuclear Science; Oct. 2004; vol. 51, Issue: 5 , Part 1; pp. 2328-2336 (http://ieeexplore.ieee.org/iel5/23/29603/01344332.pdf?tp=&arnumber1344332&isnumber=29603).

B. Pain, B. Hancock, T. Cunningham, G. Yang, S. Seshadri, J. Heynssens, C. Wrigley; CMOS Digital Imager Design from a System-on-a-Chip Perspective; VLSI Design, 2003. Proceedings. 16th International Conference on Publication Date: Jan. 4-8, 2003; pp. 395-400 (http://ieeexplore.ieee.org/search/srchabstract.jsp?arnumber=1183168&isnumber=26547&punumber=8427&k2dockey=1183168@ieeecnfs&query=%28+%28+noise%3Cin%3Eab+%29+%3Cand%3E+%28+cmos%3Cin%3Eab+%29+%29%3Cand%3Erow+wise&pos=5).

Gabriel A. Rincon-Mora, Senior. Fooling Faraday: On-chip capacitor multipliers. Power Management DesignLine. Jul. 27, 2006. pp. 1-6. CMP Media LLC.

* cited by examiner

CAPACITOR MULTIPLER CIRCUITS AND THE APPLICATIONS THEREOF TO ATTENUATE ROW-WISE TEMPORAL NOISE IN IMAGE SENSORS

TECHNICAL FIELD

This invention relates to integrated circuitry for memory storage devices and applications thereof and, more particularly, to capacitor multiplier circuits and capacitor multiplier circuits for imaging devices, such as for Complimentary Metal Oxide Semiconductor (CMOS) image sensor devices.

BACKGROUND

In a typical analog CMOS fabrication process, capacitors are usually realized using polysilicon-to-polysilicon layers. In this realization, two layers of polysilicon sandwich a thin silicon dioxide ($SiO_2$) layer. This structure usually creates a relatively high capacitance per area so that the real estate chip area remains low and thus the cost of realizing the capacitor remains low. The capacitor density realized by these two layers is in the order of a few femto-farads per square micron ($fF/\mu m^2$).

However, in a typical digital CMOS fabrication process, because two layers of polysilicon may not be available, capacitors may be realized using metal-to-metal layers. The capacitor density realized by two metal layers is usually even lower because the oxide between these two layers is even thicker than the polysilicon-to-polysilicon layer available in an analog CMOS process. Therefore, realizing a physically large capacitor on the integrated circuit (IC) is very costly in any integrated circuit process unless special fabrication process steps have been added to implement it. However, fabrication process modification may be very costly. IC designers usually consider capacitors higher than 100 pF a physically large capacitor with unreasonable fabrication costs and therefore such a large capacitor can be avoided unless there is no choice or the benefit of having such a large capacitor outweighs its real-estate cost.

When considering the use of large capacitors for noise attenuation in a typical CMOS image sensor, the voltages on a floating diffusion of the image sensor pixels are sensed by a gate of a transistor which is configured as a source-follower amplifier. DC bias currents in source-amplifiers of a single row are supplied by a series of current sources. One of the sources of noise in CMOS image sensors is row-wise temporal noise. This noise shows up as strips that change their locations every time a new frame of an image is captured. The strips are not spatially fixed or stationary and their locations are a function of time, thus the term temporal noise.

Figure 1:
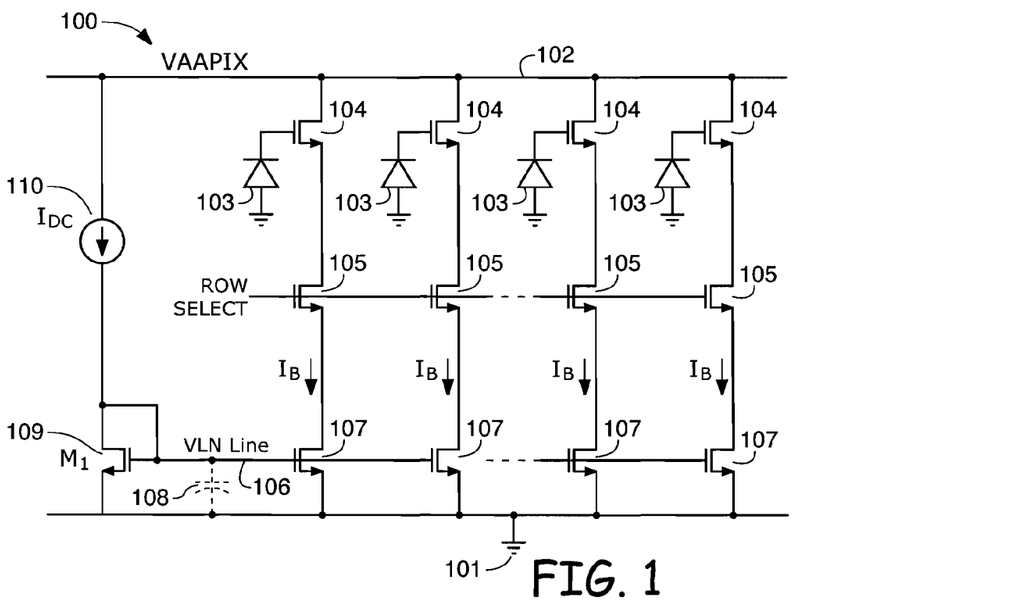
FIG. 1 is a prior art illustration of an image sensor circuit comprising a row of image sensor pixels and the associated current sources.

FIG. 1 depicts a simplified circuit diagram 100 comprising a row of image sensor pixels and their associated bias current sources 107 connected between ground 101 and VAAPIX supply 102. Each image sensor pixel comprises floating diffusion photodiode 103 and source follower amplifier 104 of which are selected by row select transistor 105. As shown in FIG. 1, the VLN line (node 106) is a single DC voltage set by diode connected transistor $M_1$ 109, that supplies bias voltage to all bias current sources 107. In this layout, the VLN line 106 is usually a metal layer that extends across the image sensor pixel array from one side of the imaging integrated circuit (IC) to the other. Depending on the size of the CMOS image sensor, VLN line 106 can be a few millimeters long, which is much larger than a typical layout trace. This long trace, being a relatively high impedance line, acts as an antenna in the IC that can pick up noise from any noisy environment (digit switching, ground bounces, supply bounces, etc.).

In the CMOS image sensor, such as the image sensor 100 depicted in FIG. 1, one of the mechanisms that causes a source of noise, referred to as row-wise temporal noise, is the temporal noise developed on the VLN line 106. By placing a capacitor 108 between VLN line node 106 to ground 101, it is possible to filter out (attenuate) some of the noise present on the VLN line. However, this capacitor is required to be large due to the row-wise temporal noise frequency being in the low frequency range. The capacitor 108 between VLN line 106 and ground 101 and the small signal resistance created by the trans-conductance (1/gm) of the diode connected transistor $M_1$ 109, form a low pass filter that attenuates the noise on the VLN line. The larger the capacitor, the lower the pole of the low-pass filter, thus producing a quieter DC bias voltage on the VLN line. To improve the row-wise temporal noise, the capacitor should be in the range of several hundreds of pico-farad up to a few nano-farad, which presents a major fabrication obstacle in creating the large noise attenuating capacitor needed. Due to limited space on the IC die, the physical size of capacitor needed to attenuate the row-wise temporal noise is prohibitive.

Therefore, what is needed in the art for integrated circuits is a way to effectively attenuate temporal noise by providing an effective large capacitance, which, in conjunction with other circuit elements will create a low pass frequency filter that may be used to reduce row-wise temporal noise, such as in a CMOS image sensor device.

DETAILED DESCRIPTION

In the following detailed description, reference is made to the accompanying drawings, which form a part hereof, and in which is shown by way of illustration of specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the invention.

The term "pixel" refers to a picture element unit cell containing a photosensor and transistors for converting electromagnetic radiation to an electrical signal.

Preferred embodiments of the present disclosure provide capacitor multiplier circuits and the integration thereof into IC devices such as for CMOS Image sensor devices, as described below with reference to FIGS. 3-6 and general implementations thereof in FIG. 8 and FIG. 9.

Figure 2:
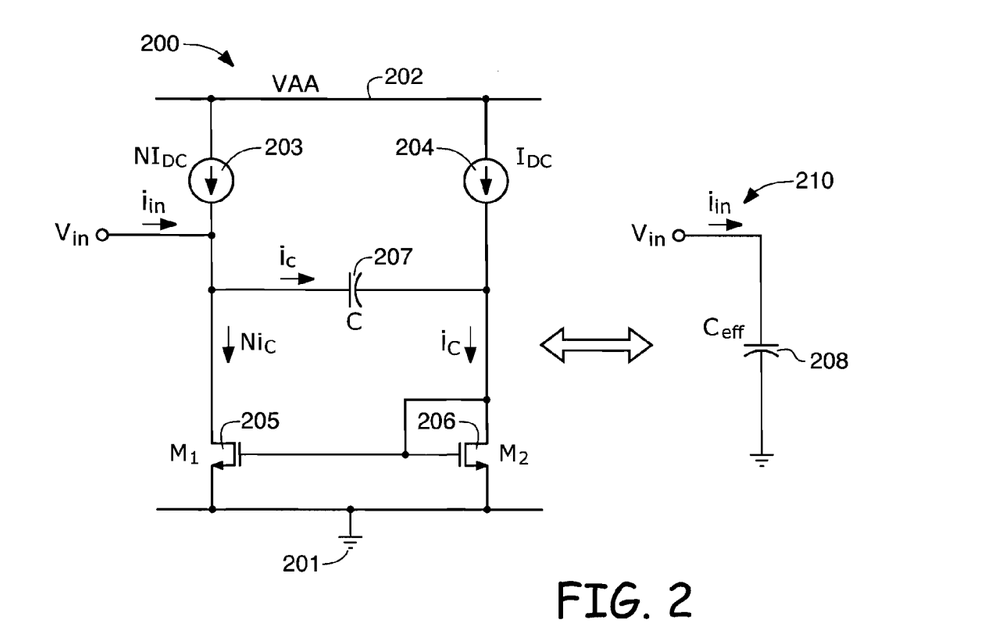
FIG. 2 is a conceptual circuit of the present disclosure depicting an N-times capacitor multiplier circuit and its equivalent AC circuit.

FIG. 2 depicts a basic concept of a capacitor multiplier circuit 200 and its equivalent AC circuit 210. Circuit 200 is connected between supply 202 (VAA) and ground 201 with DC current sources 203 and 204 supplying current source NMOS transistors 205 ($M_1$) and diode connected transistor 206 ($M_2$). The aspect ratio, i.e. channel Width/Length (W/L) of current source NMOS transistor 205 ($M_1$) is N times larger than the aspect ratio of diode-connected NMOS transistor 206 ($M_2$). The capacitor multiplier circuit 200 realizes a large capacitance (or equivalent capacitor, $C_{eff}$) from a relatively small on-chip capacitor 207 (C) with the help of a common current multiplier circuit. An equivalent capacitance 208 ($C_{eff}$) of a capacitor multiplier circuit is a much larger capacitance from an AC standpoint when looking at a $V_{in}$ terminal to ground. The capacitor multiplier circuit can only generate a large grounded capacitor as it is not possible to create a fully floating capacitor multiplier. However, for the purpose of the row-wise temporal noise reduction, only a large capacitance from VLN line to ground is required.

The capacitor multiplier circuit 200 works as follows: The AC current input signal $i_{in}$ derives the capacitor 207 (C) and the current controlled current source or current amplifier made up of NMOS transistor 205 ($M_1$) and diode connected NMOS transistor 206 ($M_2$). Assuming the DC current sources 203 ($NI_{DC}$) and 204 ($I_{DC}$) are perfect (ideal) sources, the following equations for an AC signal can be written as:

$$i_{in} = i_c + Ni_c = (N+1)i_c, \quad (1)$$

Where in the s-domain analysis of an AC signal capacitor C is replaced by an equivalent impedance as:

$$C = 1/sC_{eff}, \text{ then} \quad (2)$$

$$v_{in}/i_{in} = 1/sC_{eff} = v_{in}/(N+1)i_c = 1/(N+1)sC. \quad (3)$$

Therefore the effective (resulting) capacitance, as illustrated in equivalent circuit 201, will become:

$$C_{eff} = (N+1)C. \quad (4)$$

Equation 4 demonstrates the DC current can be easily multiplied, such as by a factor of 10 to 100. For example, if N=80, and C=25 pF, then $C_{eff}$=2025 pF. It is noted that assumptions for reaching such a high capacitance value are: 1) The DC current sources are considered to be ideal, which means that their output impedance is infinite. 2) The bottom plate of the 25 pF capacitor must be as low impedance as possible. 3) The larger the N value, the less accurate is the current amplification. The sizing of the NMOS and PMOS transistors (channel width (W) and channel length (L)) for each of the embodiments of the present invention will be determined by typical CMOS design rules and it is desired that the value of N be reduced as much as possible depending on how big a capacitance is desired.

Figure 3:
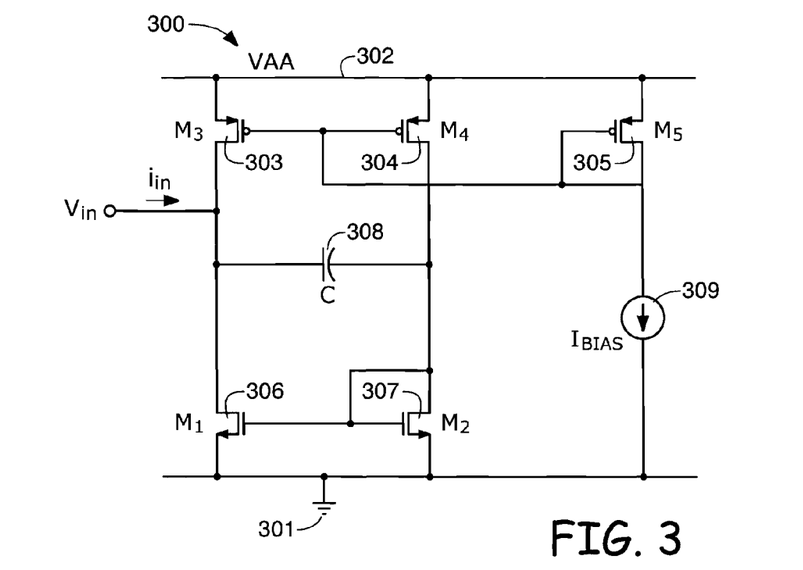
FIG. 3 is an embodiment of the present disclosure depicting a capacitor multiplier circuit utilizing a simple current source that may be coupled to an image sensor circuit.

An embodiment of the present disclosure, as depicted in FIG. 3, shows a capacitor multiplier circuit 300 connected between supply 302 (VAA) and ground 301 using a simple current source comprising DC current source PMOS transistor 303 ($M_3$), sized as N(W/L), and PMOS transistor 304 ($M_4$), sized as W/L connected to current control NMOS transistor 306 ($M_1$), sized as N(W/L) and diode connected NMOS transistor 307 ($M_2$), sized as W/L. Capacitor 308 (C) is connected in parallel to the interconnected NMOS transistors 306 and 307 and PMOS transistors 303 and 304 and is responsive to an AC signal that generates $v_{in}$ and $i_{in}$. Diode connected PMOS transistor 305 ($M_5$) provides current, 309 ($I_{BIAS}$) to PMOS transistors 303 ($M_3$) and 304 ($M_4$) that in turn sets the DC reference current $I_{DC}$ (from $M_4$) and DC output current $NI_{DC}$ (from $M_5$), as determined by the sizing of each transistor. Diode connected NMOS transistor 307 ($M_5$) sets the biasing level to output NMOS transistor 306 ($M_1$) and the current amplification, in response to an AC is determined by the sizing of each transistor as discussed in FIG. 2.

Continuing with FIG. 3 and using the analysis of an AC signal shown in FIG. 2, the effective capacitance ($C_{eff}$) of capacitor 308 (C) in response to an AC input ($v_{in}$) is derived by a generated $i_{in}$ to create $C_{eff}=(N+1)C$, thus multiplying the effective capacitance of a relatively small capacitor 308 (C). When coupling the capacitor multiplier circuit 300 to supply a row of image sensor pixels, such as presented in FIG. 1, $C_{eff}$ will create a desired filtering capacitance between VLN line 106 (seen in FIG. 1) and ground which will effectively function as a means to filter or attenuate row-wise temporal noise (i.e., low frequency noise up to 1 MHz and particularly in the range of 1 KHz-1 MHz) along the row of image sensor pixels 101.

Figure 4:
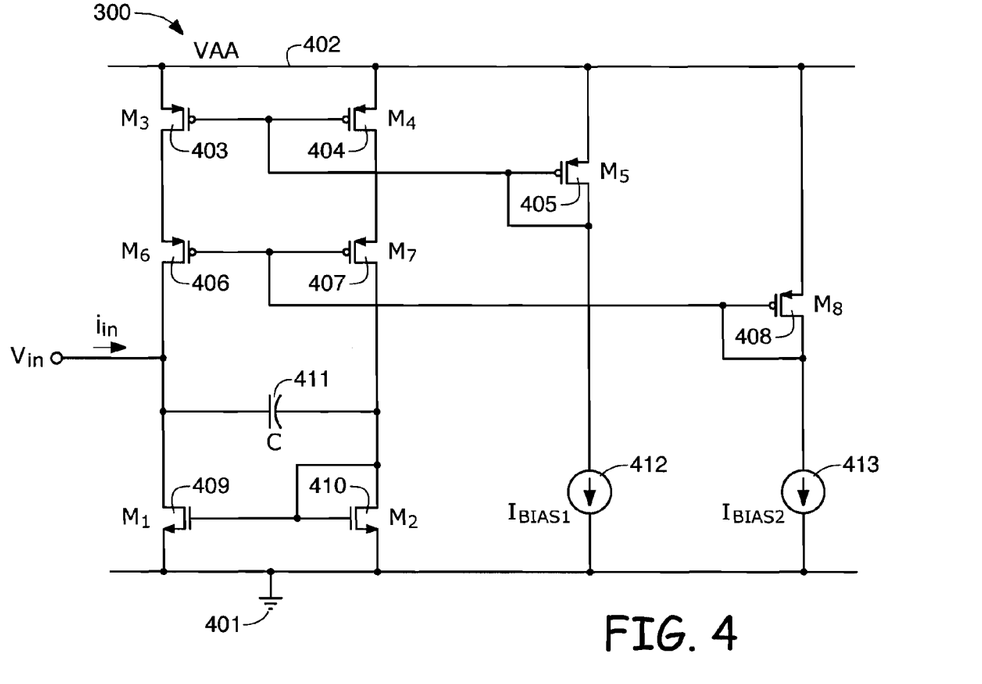
FIG. 4 is another embodiment of the present disclosure depicting a novel capacitor multiplier circuit utilizing a cascode current source that may be coupled to an image sensor circuit.

Another embodiment of the present disclosure, as depicted in FIG. 4, shows a capacitor multiplier circuit 400 connected between supply 402 (VAA) and ground 401 using a PMOS cascode current source. Capacitor multiplier circuit 400 comprises an NMOS current source of NMOS transistor 409 ($M_1$), sized as N(W/L), and diode connected NMOS 410 ($M_2$), sized as W/L, connected to the cascode current source arrangement of PMOS transistor 406 ($M_6$) and PMOS transistor 407 ($M_7$) and PMOS transistor 403 ($M_3$), sized as N(W/L), and PMOS transistor 404 ($M_4$), sized as W/L. Capacitor 411 (C) is connected in parallel to PMOS transistors 406 and 407 and NMOS transistors 409 ($M_1$) and 410 ($M_2$) and is responsive to an AC signal that generates $v_{in}$ and $i_{in}$.

Diode connected PMOS transistor 405 ($M_5$) provides DC bias current, 412 ($I_{BIAS1}$) to PMOS transistors 403 ($M_3$) and 404 ($M_4$) and diode connected PMOS transistor 408 ($M_8$) provides DC bias current, 413 ($I_{BIAS2}$) to PMOS transistors 406 ($M_6$) and 407 ($M_7$) that in turn set the DC reference current $I_{DC}$ (via $M_7$ and $M_4$) and DC output current $NI_{DC}$ (via $M_6$ and $M_3$) as determined by the sizing of each transistor. Diode connected NMOS transistor 410 ($M_2$) sets the biasing level to output NMOS transistor 409 ($M_1$) and the current amplification, in response to an AC single, is determined by the sizing of each transistor as discussed in FIG. 2.

Again, as discussed in FIG. 2, the effective capacitance ($C_{eff}$) of 411 (C) in response to an AC input ($v_{in}$) is derived by the generated $i_{in}$ to create $C_{eff}=(N+1)C$, thus multiplying the effective capacitance of a relatively small capacitor 411 (C), when coupling the capacitor multiplier circuit 400 to supply a row of image sensor pixels, such as presented in FIG. 1. $C_{eff}$ of FIG. 4 will create a desired filtering capacitance between VLN line 106 (seen in FIG. 1) and ground which will effectively function as a means to filter row-wise temporal noise (i.e., low frequency noise up to 1 MHz), particularly in a frequency range of 1 KHz to 1 MHz as illustrated in the frequency response curve of FIG. 7 (discussed later).

Figure 5:
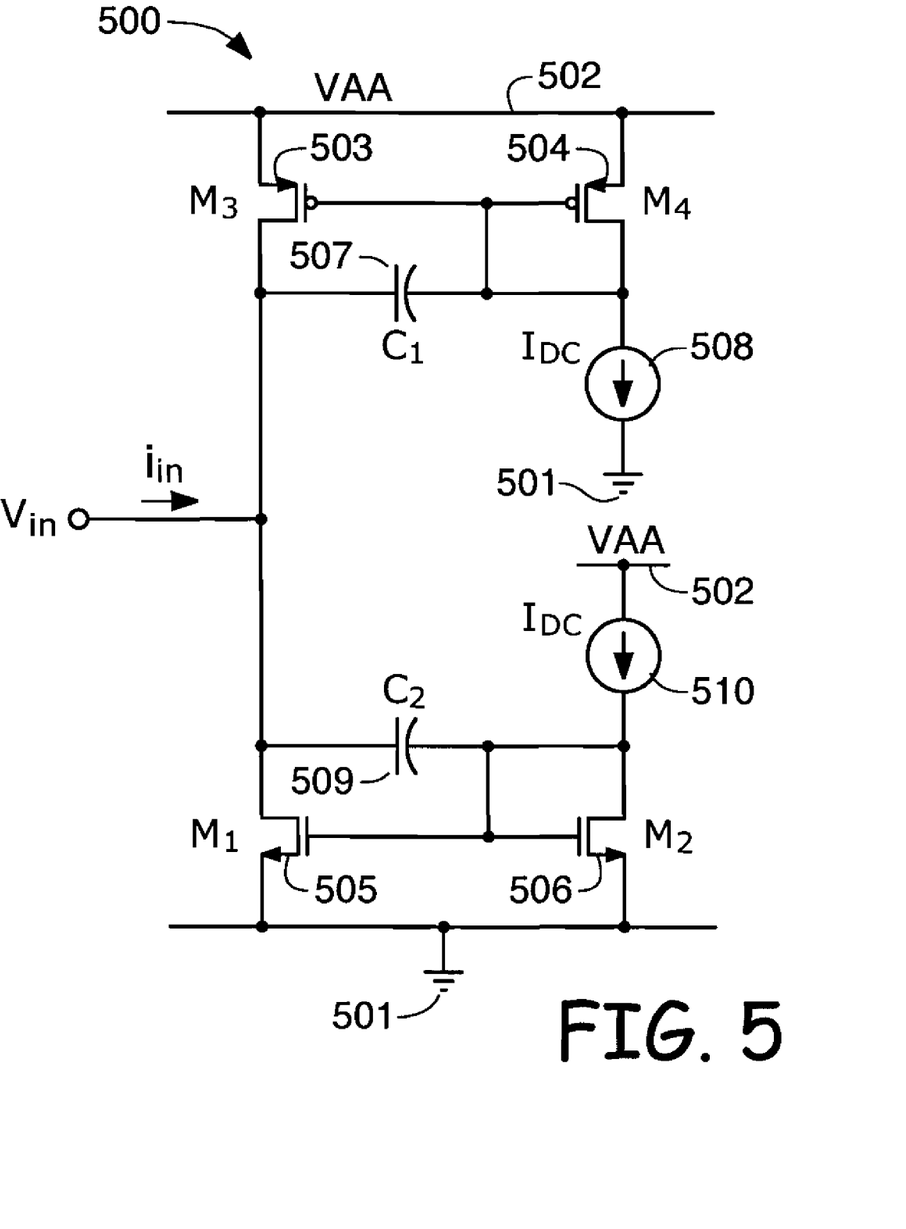
FIG. 5 is another embodiment of the present disclosure depicting a capacitor multiplier circuit utilizing complementary current sources that may be coupled to an image sensor circuit.

Another embodiment of the present disclosure, as depicted in FIG. 5, shows a capacitor multiplier circuit 500 connected between supply 502 (VAA) and ground 501 using complementary current sources. The first complementary current source provides DC current 510 ($I_{DC}$), as set by diode connected NMOS transistor 506 ($M_2$), sized as W/L, and current amplifier NMOS transistor 505 ($M_1$), sized as N(W/L), with capacitor 509 ($C_2$) connected in parallel across NMOS transistors 505 ($M_1$) and 506 ($M_2$). In a similar, but complimentary manner, the second complementary current source provides bias current 508 ($I_{DC}$) as set by diode connected PMOS transistor 504 ($M_4$), sized as W/L, and current amplifier PMOS transistor 503 ($M_3$), sized as N(W/L), with capacitor 507 ($C_1$) connected in parallel across PMOS transistors 503 ($M_3$) and 504 ($M_4$).

The capacitance values of $C_1$ and $C_2$ of FIG. 5, when compared to the capacitor multiplier circuits having a single capacitor (C), will be half the capacitance of C and thus represented as $C_1$=C/2 and $C_2$=C/2. Thus, in the capacitor multiplier circuit of FIG. 5, capacitors 509 ($C_2$) and 507 ($C_1$) may be even smaller in physical size as $C_{eff}$ will result in the parallel combination of these two capacitors, as the effective capacitance ($C_{eff}$) of capacitor 509 ($C_2$) plus capacitor 507 ($C_1$) in response to an AC input ($v_{in}$) is derived by the generated $i_{in}$ to create $C_{eff}$=(N+1)($C_1$+$C_2$) or $C_{eff}$=(N+1)(C/2+C/2)=(N+1)C. Thus, the effective capacitance results in the multiplying of two relatively small capacitors 509 and 507, when coupling the capacitor multiplier circuit 500 to supply a row of image sensor pixels, such as presented in FIG. 1. $C_{eff}$ of FIG. 5 will create a desired filtering capacitance between VLN line 106 (seen in FIG. 1) and ground and will effectively function as a means to filter row-wise temporal noise (i.e., low frequency noise up to 1 MHz), particularly in a frequency range of 1 KHz to 1 MHz as illustrated in the frequency response curve of FIG. 7.

Figure 6:
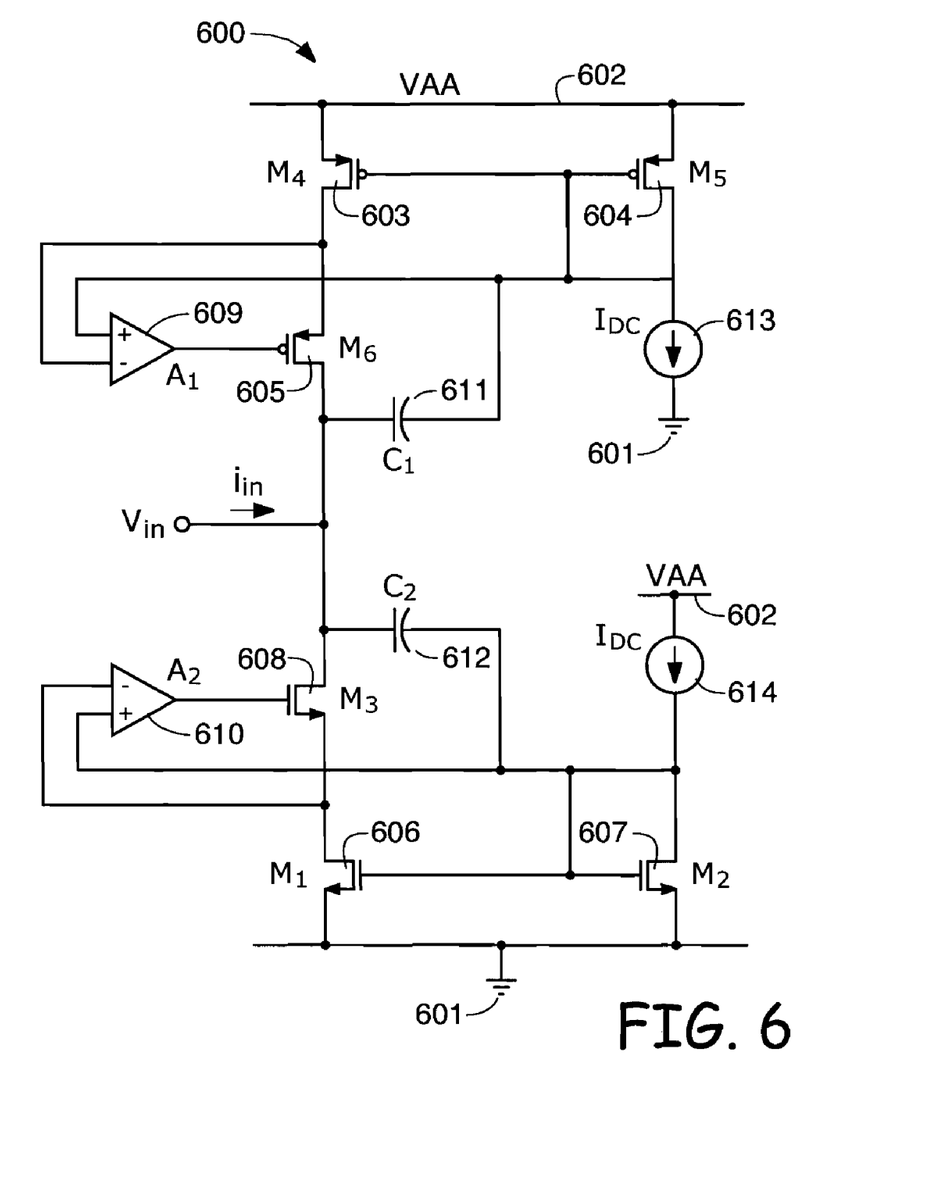
FIG. 6 is another embodiment of the present disclosure depicting a novel capacitor multiplier circuit utilizing output resistance boosted current sources that may be coupled to an image sensor circuit.

Another embodiment of the present disclosure, as depicted in FIG. 6, shows a capacitor multiplier circuit 600 connected between supply 602 (VAA) and ground 601 using output resistance boosted current sources. The first output resistance boosted current source comprises NMOS transistor 606 ($M_1$), sized as N(W/L), diode connected NMOS 607 ($M_2$), sized as W/L, that sets bias current 614 ($I_{DC}$) and is connected to operational amplifier 610 ($A_2$) which drives NMOS transistor 608 ($M_3$), sized as N(W/L). Capacitor 612 ($C_2$) is connected in parallel to the first output resistance boosted current source by connecting across the drains of NMOS transistor 608 ($M_3$) and NMOS transistor 607 ($M_2$). The second output resistance boosted current source comprises PMOS transistor 603 ($M_4$), sized as N(W/L), diode connected PMOS 604 ($M_5$), sized as W/L, that sets bias current 613 ($I_{DC}$) and is connected to operational amplifier 609 ($A_1$) that drives PMOS transistor 605 ($M_6$), sized as N(W/L). Capacitor 611 ($C_1$) is connected in parallel to the second output resistance boosted current source by connecting across the drains of PMOS transistor 605 ($M_6$) and PMOS transistor 604 ($M_5$).

As discussed in FIG. 5, the capacitance values of $C_1$ and $C_2$ of FIG. 6, when compared to a capacitor multiplier circuit having a single capacitor (C), will be half the capacitance of C and thus represented as $C_1$=C/2 and $C_2$=C/2. Thus, in the capacitor multiplier circuit of FIG. 6, capacitors 611 and 612 may be even smaller in size as the $C_{eff}$ will be result in the parallel combination of these two capacitors, as the effective capacitance ($C_{eff}$) of capacitor 612 ($C_2$) plus capacitor 611 ($C_1$) in response to an AC input ($v_{in}$) is derived by the generated $i_{in}$ to create $C_{eff}$=(N+1)C or $C_{eff}$=(N+1)(C/2+C/2)=(N+1)C. Thus the effective capacitance results in the multiplying of two relatively small capacitors 612 and 611, when coupling the capacitor multiplier circuit 600 to supply a row of image sensor pixels, such as presented in FIG. 1. $C_{eff}$ of FIG. 6 will create a desired filtering capacitance between VLN line 106 (seen in FIG. 1) and ground and will effectively function as a means to filter row-wise temporal noise (i.e., low frequency noise up to 1 MHz), particularly in a frequency range of 1 KHz to 1 MHz.

Figure 7:
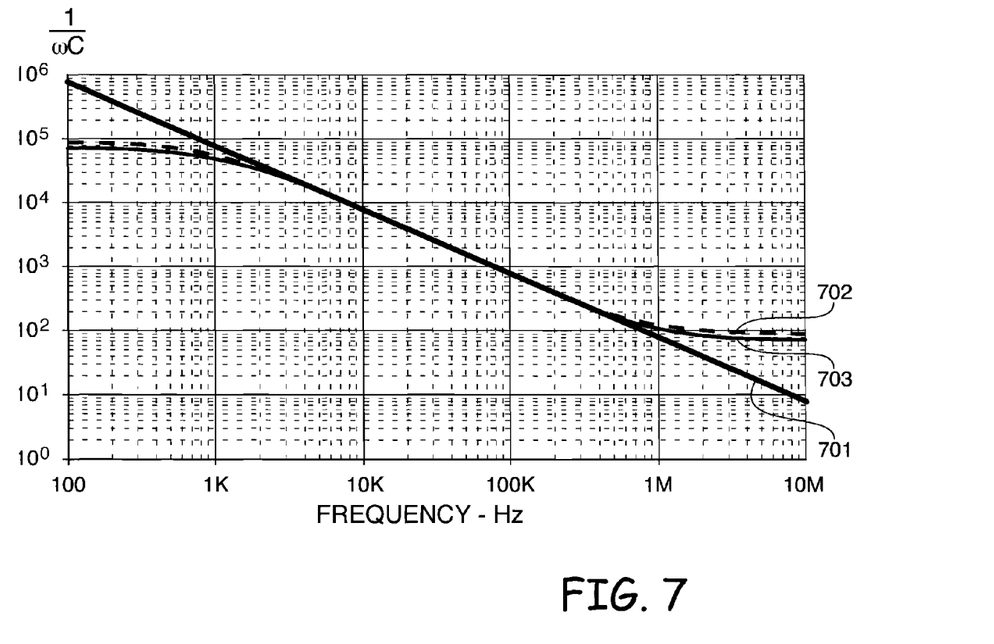
FIG. 7 is an illustration of an AC frequency response curve representative of capacitor multiplier circuits of the present disclosure and an ideal capacitor.

The frequency response curves of FIG. 7 plotted as 1/ωC (magnitude of impedance) vs. frequency (Hz), shows the frequency responses of the capacitor multiplier circuit arrangements of FIG. 4 (curve 702) and FIG. 5 (curve 703), each of which are compared against curve 701 of an ideal 2025 pF capacitor. As shown in FIG. 7 both circuit configurations have a similar frequency response. At low frequencies (below 1 KHz) and at high frequencies (above 1 MHz), both circuit arrangements deviate from an ideal 2025 pF capacitor response as frequency response curves 702 and 703 begin to flatten out above and below those frequency ranges. However, in the frequency range of approximately 1 KHz to 1 MHz, both capacitor multiplier circuit arrangements of FIG. 4 and FIG. 5 act almost identical to the response of an ideal capacitor.

It is anticipated that other values of derived effective capacitances from capacitor multiplier circuits, such as the circuits of FIG. 3 and FIG. 6, will have similar frequency response results to those as depicted in the frequency response curve of FIG. 7, when compared to the respective ideal capacitor. It is further anticipated that frequency response of the capacitor multiplier circuit of FIG. 6 will provide the best frequency response of the several embodiments of capacitor multipliers circuits disclosed when compared to an ideal capacitor due to the enhanced output impedance. However, due to being a somewhat complicated circuit, this circuit may possess possible fabrication limitations when integrated into a CMOS Image sensor device. However, the capacitor multiplier circuit of FIG. 6 may prove to serve as a superior capacitance multiplier in many integrated circuit applications, such as analog devices that would benefit from a small signal capacitor multiplier circuit for attenuating low frequencies.

The following example is used to estimate the range of the row-wise temporal noise frequency for a typical image sensor case. If the frame rate of a typical CMOS image sensor is 10 frames per second and the sensor has approximately 2500 rows per frame then the row-wise temporal noise frequency must be in the vicinity of 25 KHz. Thus it can be assumed the row-wise temporal noise frequency is in the range of a few tens of KHz, which is a slow varying noise. At around this frequency range, as demonstrated in the frequency response curve of FIG. 7, the capacitor multiplier AC response is identical to the performance of an ideal 2025 pF capacitor. Therefore, the various capacitor multiplier circuits of the present disclosure can be utilized to mimic a very large capacitor on chip (integrated circuit), such as on an image sensor chip to act as a very large capacitance (in the order of 2 nF) in order to filter out the temporal row-wise noise on the VLN line.

The capacitor multiplier is a small, simple, stand alone circuit that can easily be realized on-chip by one skilled in the art and can be enabled and disabled by turning on/off the DC current sources that feed the circuit. The block diagram of FIG. 8 represents an implementation of any one of the capacitor multiplier circuits of the present disclosure as integrated into a CMOS image sensor device 800. As an example, the capacitor multiplier circuit of FIG. 3 is integrated with an image sensor circuit comprising a row of image sensor pixels and their associated current sources. It is to be understood that any of the capacitor multiplier circuits disclosed, including any similar designs thereof, can be integrated with an image sensor circuit in the manner indicated with the example of FIG. 3 as subsequently set forth.

Figure 8:
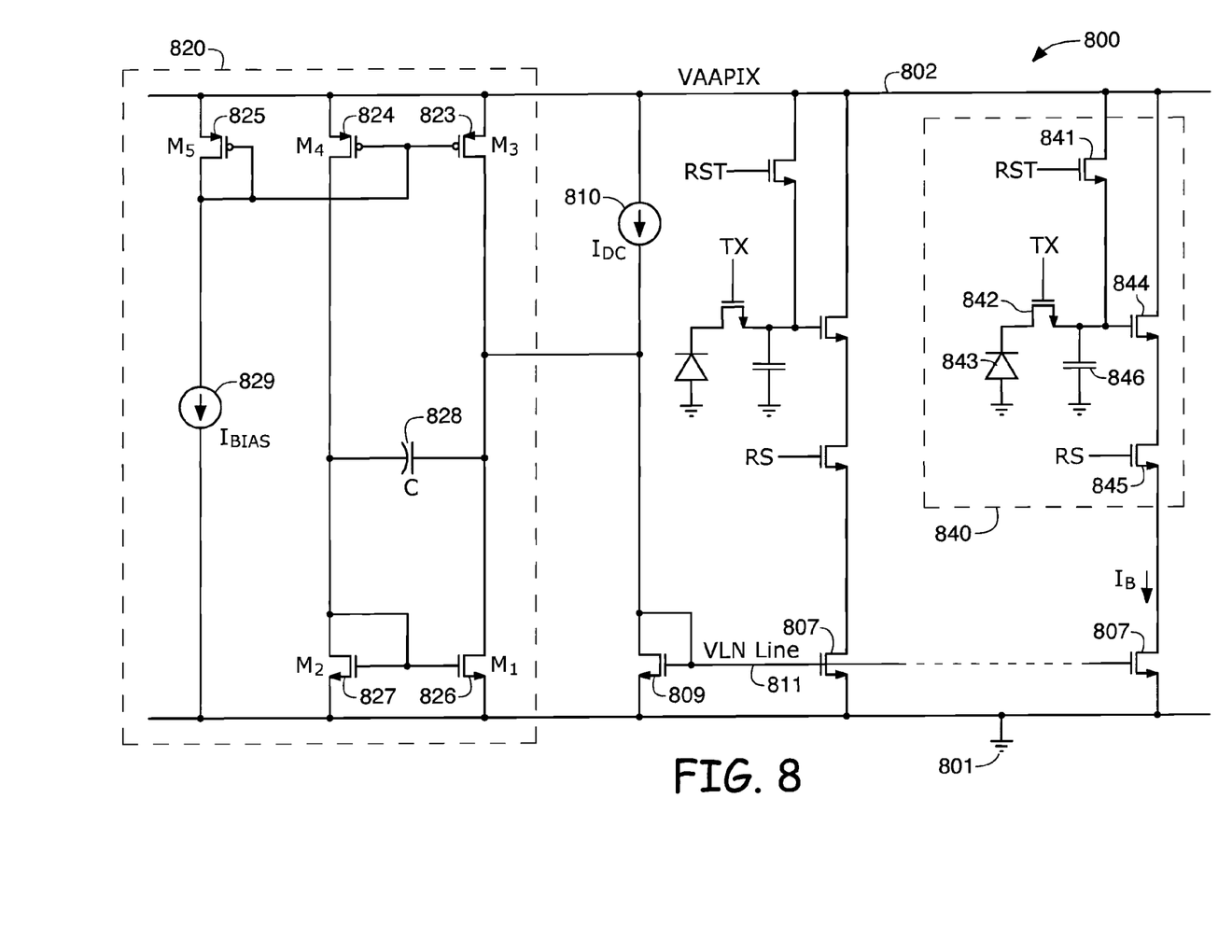
FIG. 8 is an illustration of a block diagram representing any one of the capacitor multiplier circuits of the present disclosure, but specifically showing the integration of a capacitor multiplier circuit of FIG. 3, containing the components thereof, connected to a row of CMOS image sensor pixels.

Referring now to FIG. 8, the block diagram shows CMOS image sensor device 800 comprising an image sensor circuit 802 and a capacitor multiplier circuit 820 connected between VAAPIX 802 and ground 801. The image sensor circuit 802 comprises an array of image sensor pixels 840, each of which comprises a reset transistor 841, a transfer transistor 842, a photodiode 843, a floating diffusion 846, a source follower transistor 844 and a row select transistor 845, connected in typical fashion of a four transistor image sensor pixel. A row of bias current sources 807 connect to their respective pixels 840 via the appropriate row select transistor 845. Bias current sources 807 receive a set bias voltage through diode connected transistor 809, which also determines the DC current level indicated by $I_{DC}$ 810.

The capacitor multiplier circuit 820 comprises a simple current source connected between supply 802 (VAAPIX) and ground 801 using a simple current source comprising DC current source PMOS transistor 823 (M3), sized as N(W/L), and PMOS transistor 824 ($M_4$), sized as W/L, connected to current control NMOS transistor 826 ($M_1$), sized as N(W/L) and diode connected NMOS 827 ($M_2$), sized as W/L. Capacitor 828 (C) is connected in parallel to the interconnected NMOS transistors 826 and 827 and PMOS transistors 823 and 824 and is responsive to an AC signal that generates $V_{in}$ and $i_{in}$. Diode connected PMOS transistor 825 ($M_5$) provides current, 829 ($I_{BIAS}$) to PMOS transistors 823 ($M_3$) and 824 ($M_4$) that in turn sets the DC reference current $I_{DC}$ (from $M_4$) and DC output current $NI_{DC}$ (from $M_3$) as determined by the sizing of each transistor. Diode connected NMOS transistor 827 ($M_s$) sets the biasing level to output NMOS transistor 826 ($M_1$) and the current amplification, in response to an AC signal, is determined by the sizing of each transistor as discussed in accordance with FIG. 2.

A capacitor 828 (C), in response to an AC input ($v_{in}$), is derived by a generated $i_{in}$ to create $C_{eff}=(N+1)C$, thus multiplying the effective capacitance of a relatively small capacitor 828 (C). With the capacitor multiplier circuit 820 coupled to supply a row of image sensor pixels, such as image sensor pixel 840 by way of their respective bias current sources 807, $C_{eff}$ will create a desired capacitance, from filtering capacitor 828, between VLN line 811 and ground that effectively functions as a means to filter or attenuate row-wise temporal noise (i.e., low frequency noise up to 1 MHz and particularly in the range of 1 KHz-1 MHz) along the row of image sensor pixels 840.

Figure 9:
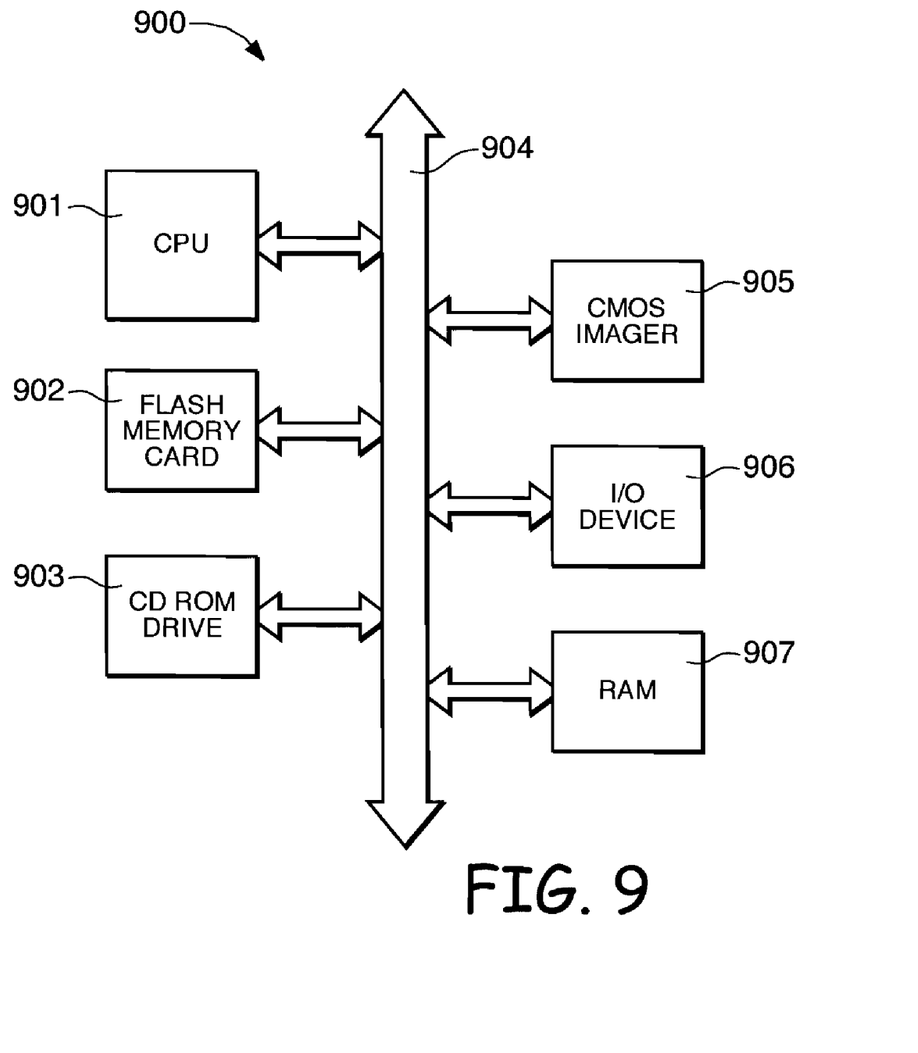
FIG. 9 depicts a processor system having digital circuits, which could include any of the CMOS image sensor capacitor multiplier circuits of the present disclosure.

FIG. 9 depicts a processor system having digital circuits, which could include any of the CMOS image sensor cell designs of the present disclosure. Referring to FIG. 9, a processor system 900, such as a computer system, generally comprises a central processing unit (CPU) 901, for example, a microprocessor that communicates with an input/output (I/O) device 906 over a bus 904. The CMOS image sensor device 905 also communicates with the system over bus 904. The processor system 900 may also include random access memory (RAM) 907, and, in the case of a computer system, may include peripheral devices such as a flash memory card 902, or a compact disk (CD) ROM drive 903 which also communicate with CPU 901 over the bus 904. It may also be desirable to integrate the CPU 901, CMOS image sensor device 905 and memory 907 on a single IC chip. Without being limiting, such a processor system could include a computer system, camera system, scanner, machine vision, vehicle navigation, video phone, surveillance system, auto focus system, star tracker system, motion detection system, image stabilization system and data compression system for high-definition television, all of which can utilize the invention.

It should be noted that although the present disclosure has been described with specific reference to several capacitor multiplier circuits and to CMOS image sensors comprising any one of the capacitor multiplier circuits, the invention has broader applicability and may be used in any imaging apparatus where low frequency noise, such as row-wise temporal noise, is a concern. The above description and drawings illustrate preferred embodiments which achieve the objects, features and advantages of the invention. It is not intended that the present disclosure be limited to the illustrated embodiments and any modification thereof which comes within the spirit and scope of the following claims should be considered part of the present disclosure.

What is claimed is:

1. A CMOS image sensor device comprising:
   an image sensor circuit connected between a first power supply and a second power supply;
   an array of image sensor pixel circuits, each image sensor pixel being connected to a bias current source transistor by a row select transistor, the bias current source transistor having a voltage bias level set by a diode connected transistor;
   a capacitor multiplier circuit being connected between the first power supply and the second power supply, the output of the capacitor multiplier circuit being connected to the diode connected transistor and bias current transistors, the capacitor multiplier circuit being responsive to an alternating current signal, the capacitor multiplier circuit having a current controlled current source and a capacitor.

2. The image sensor circuit of claim 1, wherein, the capacitor multiplier circuit electrically creates an effective capacitance in response to the alternating current signal that attenuates frequencies at around 1 MHz and below.

3. The CMOS image sensor device of claim 1, wherein the capacitor multiplier circuit comprises a capacitor connected across a current source such that the effective capacitance is created in response to an AC signal.

4. The CMOS image sensor device of claim 3, wherein the current source comprises a DC current source connecting to a current control current source, the capacitor connecting in parallel to both the DC current source and the current control current source.

5. The CMOS image sensor device of claim 4, wherein the DC current source comprises PMOS transistors arranged as a cascode current source.

6. The CMOS image sensor device of claim 3, wherein the current source comprises complementary current sources, a first capacitor connecting in parallel to a PMOS current source and a second capacitor connecting in parallel to an NMOS current source.

7. The CMOS image sensor device of claim 3, wherein the current source comprises output resistance boosted current sources, a first capacitor connecting across a PMOS current source and PMOS transistor driven by a first operational amplifier and a second capacitor connecting across an NMOS current source and NMOS transistor driven by a second operational amplifier.

8. The CMOS image sensor device of claim 1, wherein the AC signal comprises row-wise temporal noise generated on the DC bias voltage line connecting to a row of image sensor pixels.

9. The image sensor circuit of claim 8, wherein the capacitor multiplier circuit creates a low pass filter to the row-wise temporal noise along a row of CMOS image sensor pixels, the row-wise temporal noise frequencies being between 1 KHz and 1 MHz.

10. The CMOS image sensor device of claim 8, wherein the DC current source comprises PMOS transistors and the current controlled current source comprises NMOS transistors.

11. The CMOS image sensor device of claim 1, wherein the capacitor multiplier circuit creates a low pass filter to frequencies between 1 KHz and 1 MHz.

* * * * *